United States Patent [19]
Beckley

[11] 4,331,919
[45] May 25, 1982

[54] APPARATUS FOR MAGNETIC TESTING FERROMAGNETIC SHEET OR STRIP MATERIAL USING RECTANGULAR COILS

[75] Inventor: Philip Beckley, Newport, England

[73] Assignee: British Steel Corporation, Croydon, England

[21] Appl. No.: 70,525

[22] Filed: Aug. 28, 1979

[30] Foreign Application Priority Data

Sep. 8, 1978 [GB] United Kingdom ............... 36146/78

[51] Int. Cl.³ ...................... G01R 33/14; G01N 27/82
[52] U.S. Cl. ..................................... 324/222; 324/240
[58] Field of Search ................ 324/228, 234, 236–238, 324/239–242, 243, 222, 223; 336/232

[56] References Cited

U.S. PATENT DOCUMENTS

| 2,999,977 | 9/1961 | Brown | 336/232 |
| 3,156,862 | 11/1964 | Herrick | 324/242 |
| 3,504,276 | 3/1970 | Proctor et al. | 324/260 |
| 4,074,249 | 2/1978 | Minsay | 324/234 |

FOREIGN PATENT DOCUMENTS

| 1427703 | 2/1976 | United Kingdom | 324/222 |
| 527676 | 5/1977 | U.S.S.R. | 324/233 |

Primary Examiner—Palmer C. Demeo
Assistant Examiner—Walter E. Snow
Attorney, Agent, or Firm—Bacon & Thomas

[57] ABSTRACT

Apparatus for magnetic testing of sheet or strip includes a magnetizing system comprising spaced arrays of substantially parallel rectilinear conductors supported adjacent the plane of sheet or strip to be tested, the conductors being connected to carry magnetizing current so that the fields generated by the arrays are opposed.

9 Claims, 6 Drawing Figures

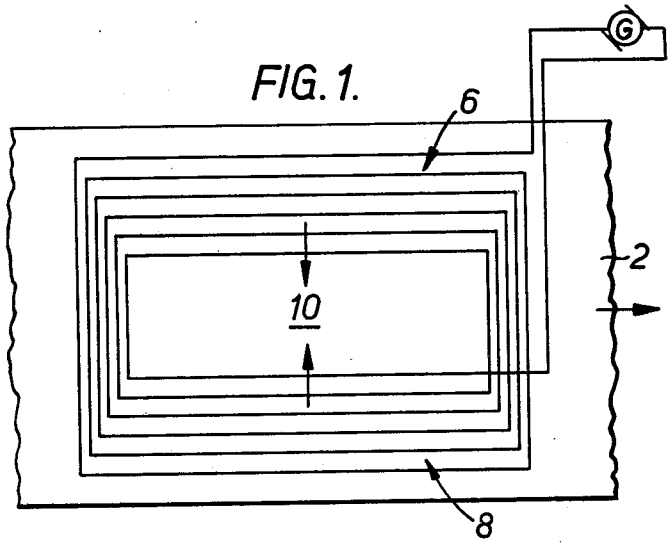
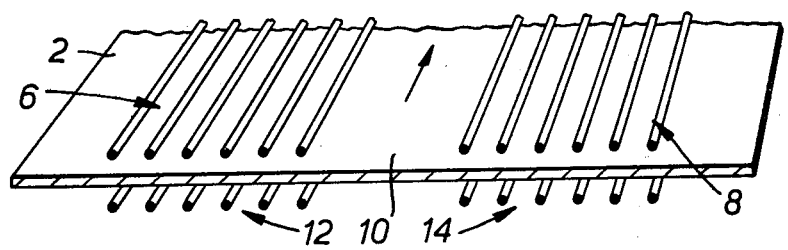
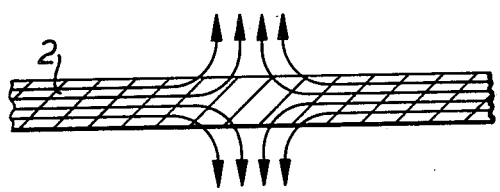

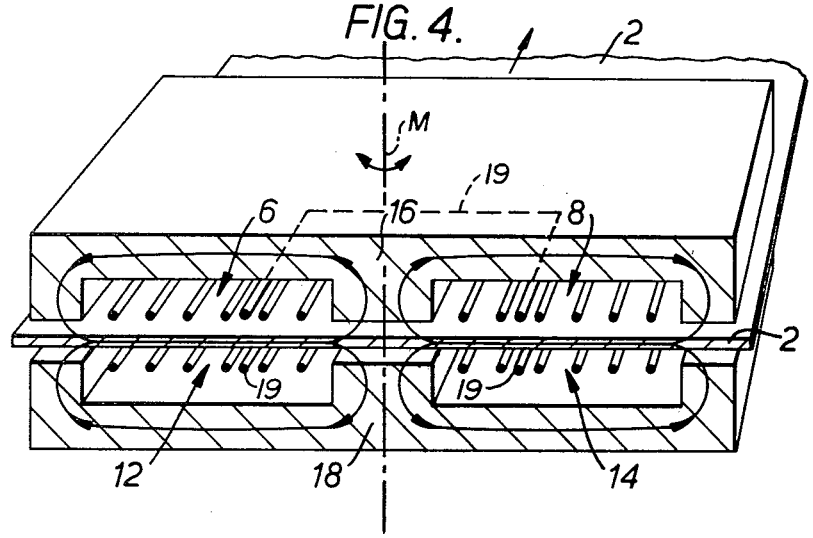
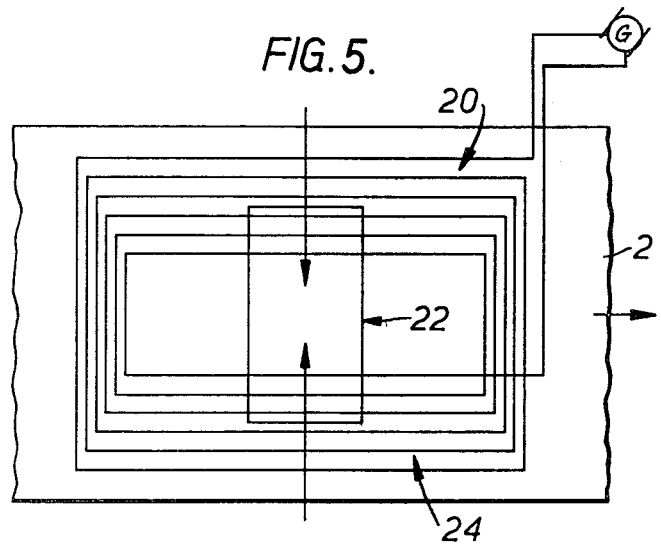

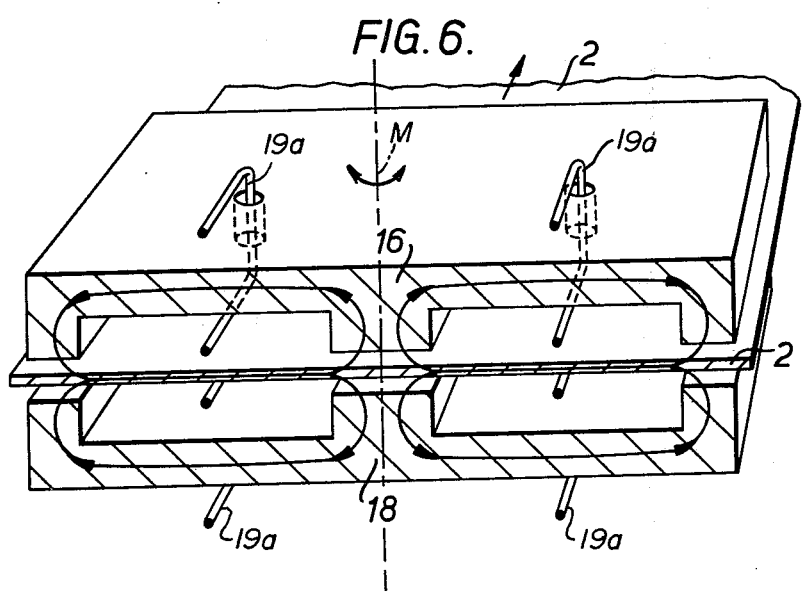

APPARATUS FOR MAGNETIC TESTING FERROMAGNETIC SHEET OR STRIP MATERIAL USING RECTANGULAR COILS

This invention relates to magnetic testing of ferromagnetic material and is particularly concerned with apparatus for continuous magnetic testing of electrical steel sheet, that is to say sheet intended to form a part of the magnetic circuit of electric machines such as transformers, motors and generators.

The production of ferromagnetic sheet or strip, particularly magnetically soft sheet and strip such as low carbon mild steel or electrical steels containing silicon at concentrations of up to 6% by weight, involves a number of annealing treatments to achieve the required mechanical and magnetic characteristics. The various annealing treatments to which the sheet is subject, particularly the final anneal, have been found to significantly affect magnetic properties, and some control of annealing conditions must occur to maintain magnetic properties within acceptable limits. One magnetic parameter of importance which must be controlled within specified limits is the total power loss which occurs in the sheet when this is excited by an alternating field; since this parameter is an accepted criterion of quality, accurate measurement of such power loss is important.

Conventionally, power loss is assessed by testing small strip samples which are cut from production material and which are arranged to form a magnetic circuit. One known method for testing power loss is known as the Epstein frame method. This is a static method and is characterised in enabling only relatively infrequent testing of strip produced on a continuous line.

When strip is produced on a continuous line, the accurate measurement of power loss must be relatively rapid if the quantity of strip produced with uncorrect magnetic properties is to be reduced to a minimum or if the rate of production is not to be slowed down while strip samples for Epstein testing are cut and measured.

In our United Kingdom Patent No. 1427703 there is disclosed and claimed apparatus for the continuous on-line testing of electrical steel strip by a method which comprises magnetising the strip at a selected region as it approaches the end of the line and measuring the induced magnetic field by way of suitable sensors. The core loss can be derived and translated for display from measurement of the applied and the induced magnetic fields.

In order to produce both a high level of accuracy and high level of consistency in the measurement of core loss, a uniform level of magnetisation must be achieved over at least that area of the strip to which the sensors are sensitive. In the apparatus disclosed in the above-mentioned patent, the strip is uniformly magnetised by a solenoid wound on a suitable former surrounding that region of the strip under test. Such a solenoid configuration however limits the testing procedure to that involving magnetic fields having lines of force substantially aligned with the direction of strip feed and provides no opportunity for testing by strip magnetisation transversely of this direction. It also poses problems in threading strip through the solenoid, particularly when this is associated with yokes effective to compensate for solenoid edge effects and other field perturbations.

Since the magnetic testing of both isotropic and anisotropic electrical steel sheet or strip with various field orientation is becoming progressively more important, it is one object of the present invention to provide means for continuously magnetising an area of strip in any selected field direction.

According to the broadest aspect of the present invention, apparatus for the magnetic testing of sheet or strip includes a magnetising system comprising spaced arrays of substantially parallel rectilinear conductors supported adjacent the plane of the sheet or strip to be tested, the conductors being connected to carry magnetising current so that the fields generated in the arrays are opposed. With this configuration the field within the space between the arrays will extend substantially normally of the plane of the sheet or strip.

The magnetic field used for testing of the sheet or strip is that generated in that area of the sheet or strip over which the conductors of each array extend; with the particular configuration of parallel and rectilinear conductors, a testing field having the best possible degree of homogeneity is obtained. By the use of the invention, the field induced in the strip will extend normally of the strip plane and can accordingly easily be sensed and measured irrespective of orientation. Since the arrays of conductors in the magnetising system of the invention merely are disposed adjacent the plane of the sheet or strip, and do not enwrap it, the direction of the field generated by the arrays can be rotated through 360° without obstruction to provide multi-directional testing.

To further reduce perturbation of the testing field generated by current flow in the arrays, the individual conductors in the arrays are interconnected by further conductors which extend normally of the arrays. With this circuit configuration the magnetic field generated by current flow in the further conductors also will have substantially no component in the direction of the magnetic field used for testing; perturbation of the testing field is thus further avoided.

Suitably arrays of the conductors are disposed adjacent each of the faces of the sheet or strip under test to improve the strength and homogeneity of the testing field.

In a preferred embodiment of the invention, the arrays of conductors are combined with a soft magnetic yoke effective to reduce the reluctance of the magnetic circuit which includes the sheet or strip under test. Conveniently the yokes are of the form having a centre limb and two outer limbs whose free ends terminate short of the plane of the sheet or strip. In the case where a pair of arrays are disposed adjacent at least one face of the sheet or strip, each array of the pair is disposed within the space between the centre limb and the respective outer limb of the yoke. Where arrays are disposed adjacent each of the faces of the sheet or strip, two substantially identical yokes are disposed symmetrically about the sheet.

To ensure that the magnetic testing apparatus of the invention can be used in any orientation, the sensor for detecting the intensity of the magnetic field induced in the sheet or strip by the applied field, must also be capable of rotation through 360°. Where the sensor suitably is a coil, inductively coupled to the field to be measured, the coil must be disposed so that it can be intersected by the field to be measured irrespective of field direction.

In one embodiment the sensor comprises a flat solenoid lying adjacent the plane of the strip in the space between the conductor arrays. In this arrangement, the coil encloses the magnetic field projecting normally of the plane of the strip. Alternatively the solenoid may be arranged to enclose a portion of the applied or induced magnetic field which extends beyond the strip edge.

In the case where the magnetising system incorporates a magnetic core, the coil may be wound around the whole of, or a portion of, the core. Conveniently the sensor coil is wound round a central portion of the core to avoid fringing end effects, by enwrapping that portion through apertures provided.

Embodiments of the invention will now be particularly described by way of example with reference to the accompanying drawings in which:

FIG. 1 is a plan view of a length of steel strip intended for electro-magnetic applications and shows spaced arrays of conductors according to the invention for inducing a magnetic field in the strip, FIG. 2 is a perspective side view of the strip of FIG. 1 showing spaced arrays of conductors adjacent each face of the strip, FIG. 3 is a sectional end on view of the strip of FIGS. 1 and 2 showing the lines of magnetic flux within the strip when magnetised by energisation of the arrays of conductors, FIG. 4 is a perspective side view of the conductor arrays of FIGS. 1 and 2 enclosed within a magnetic core, FIG. 5 is a plan view of the arrangement of FIG. 1 including a coil for sensing the magnetic field induced in the strip by energisation of the conductor arrays, FIG. 6 illustrates a further arrangement of a coil for sensing the magnetic field induced in the strip of FIG. 3.

Referring to FIG. 1 of the drawings, this illustrates continuous strip 2 of steel intended for electro-magnetic applications, moving in the direction of the arrow and at a station towards the end of the line in which it is being processed. In general the station at which the steel is tested for magnetic properties will be after final anneal and finishing and when the strip is in condition for final coiling. At this station and for testing in the manner substantially described in our United Kingdom Pat. No. 1427703, the strip is uniformly magnetised in a selected orientation which, in the embodiments described, is transversely of the direction of strip feed.

The strip is magnetised by a magnetic field generated by current flow through two arrays, 6 and 8, of parallel rectilinear conductors separated by a space 10. The arrays are connected in series relationship to a current source G so that the current in all the conductors of array 6 is unidirectional and flows in opposition to the direction of current in the conductors of the spaced array 8.

In accordance with the invention, the conductors in the array 6 and the conductors in the array 8 will each, when energised, produce a magnetic field for strip testing. The field will be substantially homogeneous over the area covered by the spaced conductors in each array and will induce a correspondingly substantially homogeneous magnetic field within strip 2. As shown in FIG. 3, the direction of the fields induced by the arrays 6 and 8 are in opposition so that within the space between the arrays the flux from the strip will emerge substantially normally of the plane of the strip. The magnetic circuits will be closed outside the strip by the field extending from space 10 entering the strip at the region of the exposed edges.

By connecting the individual conductors in the arrays by leads which extend along the induced field direction, the field generated by these leads will have no component in the direction of the induced field produced by energising the conductor arrays. Here again, minimum perturbation of the induced field will be produced by this arrangement. Preferably the connection to the current source also is by way of leads extending along the direction of the leads connecting the conductors, and will leave the field induced by the arrays substantially unperturbed.

FIG. 2 illustrates arrays of conductors symmetrically disposed to arrays 6 and 8 but adjacent the opposite face of strip 2. These further arrays, 12, 14, are similarly connected to one another and to the energising current source.

FIG. 4 illustrates the magnetising system of FIG. 2 but in which the spaced arrays of conductors adjacent opposite faces of strip 2 are enclosed within ferro-magnetic yokes 16 and 18.

Each of the yokes comprises a centre limb together with two outer limbs, all having their exposed ends terminating immediately adjacent the plane of strip 2 to reduce magnetic reluctance to a minimum. As shown in FIG. 4, arrays 6 and 8 are enclosed by core 16 respectively on opposite sides of the centre limb; similarly, arrays 12, 14, adjacent the opposite faces of strip 2 are enclosed within core 18 respectively on opposite sides of the centre limb.

Cores 16 and 18 reduce the reluctance of the magnetic circuit including the strip 2 and increase the strength of the induced magnetic field without any increase in the current necessary to energize the conductor arrays. The cores also improve field homogeneity without inhibiting the ability to magnetise the strip in any particular orientation. The array of conductors 6, 8 and 12, 14 are mounted for rotation about axis M extending normal to the plane of the strip 2 under test.

In the magnetic testing of ferrous sheet or strip, a property of the strip is derived by measuring the field induced in the strip by an applied magnetic field or a function of the strength of the applied field. The magnitude of the applied field is measured adjacent the strip by any of the means well known in the art; the induced magnetic field is measured with the strip in position within its assigned plane. In both cases, a sensor responsive to field strength must be provided enabling rotation through 360°. This is evident from the FIG. 4 illustration where sensor coils 19 are shown in parallel planes to the respective arrays 6,8 and 12, 14 and closely spaced therefrom.

More particulary, referring now to FIG. 5 there is shown a plan view of strip having adjacent one face spaced arrays 20, 24, of magnetising conductors, equivalent to the arrays 6, 8 and 12,14 depicted above with the sensor comprising a coil 22 equivalent to coil 19 lying parallel to the plane of the strip 2 and effective to intercept a substantial proportion of the magnetic field which extends from the strip normally of its plane in the space between arrays. The emf generated by the coil is proportional to the induced field and can be translated relative to the applied field to provide an indication of strip quality. In an alternative arrangement, in which the conductor arrays of FIG. 5 are enclosed within the limbs of a magnetic core, the sensor coil 22 may be accomodated in a similar position but interposed in the gap between the exposed faces of the centre limb and the strip. Such search coils may be provided adjacent each of the faces of the strip according to the arrangement of conductor arrays used for magnetisation.

FIG. 6 shows an alternative form of coil sensor used in the case where the conductor arrays (not shown, but arranged as in FIG. 4) are accomodated within a magnetic core. In this case the magnetic field induced in the strip is sensed by a coil which measures the flux in at least a portion of the core. As shown in the figure, four coils 19A suitably connected are symmetrically disposed to enwrap a central portion of the core, although further coils adjacent the opposite axial end may be provided. The loop of each coil is closed by extending through an aperture provided at the appropriate portion of the core according to the proportion of the flux therein to be sensed. This form of sensor coil arrangement has the advantage of being moved in synchronism with the core and with the magnetising system.

The coil or coils in the embodiment of FIG. 6 sense the flux which closes the magnetic circuit beyond the strip per se. A proportion of this flux will complete the magnetic circuit in air outside the yoke; due to the high permeability ratio of the yoke material to air, the proportion of the flux outside the yoke is considered negligible.

We claim:

1. Apparatus for measuring power losses in electrical steel strip including a magnetising system comprising spaced arrays of substantially parallel rectilinear conductors supported adjacent the plane of the strip and mounted for rotation about an axis normal thereto, means for energising the conductors to a known degree, the conductors being so disposed that the fluxes generated in the strip by the arrays are opposed and are projected normally of the strip between said arrays whereby to effect uniform linear magnetisation of the strip, and sensor means for measuring the intensity of said fluxes generated in the strip in response to said energisation.

2. Apparatus as claimed in claim 1 in which the individual conductors in the arrays are interconnected by further conductors which extend normally of the line of the arrays in the same plane thereof.

3. Apparatus as claimed in claims 1 or 2 wherein the arrays of conductors are disposed adjacent each of the two faces of the strip.

4. Apparatus as claimed in claims 1 or 2, wherein the arrays of conductors are combined with a soft magnetic yoke effective to reduce the reluctance of the magnetic circuit which includes said strip.

5. Apparatus as claimed in claim 4, wherein the yoke comprises a center limb and two outer limbs whose free ends terminate short of the plane of the strip.

6. Apparatus as claimed in claim 5, wherein the sensor means comprise a coil inductively coupled to the strip.

7. Apparatus as claimed in claim 6, wherein the sensor means comprises a flat coil lying adjacent the plane of the strip and between the spaced arrays.

8. Apparatus as claimed in claim 6, wherein the coil is wound around the whole of or a portion of said yoke.

9. Apparatus as claimed in claim 8, wherein the coil is wound around the center limb of the yoke.

* * * * *